United States Patent [19]

Conley

[11] 4,394,711

[45] Jul. 19, 1983

[54] CIRCUIT BOARD WITH WELDABLE TERMINALS

[75] Inventor: Larry R. Conley, Fountain Valley, Calif.

[73] Assignee: Interconnection Technology, Inc., Costa Mesa, Calif.

[21] Appl. No.: 153,565

[22] Filed: May 27, 1980

Related U.S. Application Data

[62] Division of Ser. No. 44,404, Jun. 1, 1979, Pat. No. 4,242,719.

[51] Int. Cl.³ .............................................. H05K 1/18
[52] U.S. Cl. ................................... 361/408; 174/68.5; 361/400
[58] Field of Search ...................... 174/68.5; 339/17 C, 339/176 MP, 278 T; 361/397, 400, 405, 408

[56]  References Cited

U.S. PATENT DOCUMENTS

| | | | |
|---|---|---|---|
| 3,238,421 | 3/1966 | Patrick | 174/68.5 X |
| 3,346,689 | 10/1967 | Parstorpfer | 361/411 X |
| 3,784,965 | 1/1974 | Murphy | 339/17 C X |
| 3,786,172 | 1/1974 | Conley | 339/17 C X |
| 3,912,852 | 10/1975 | Simon | 339/17 C X |
| 3,917,984 | 11/1975 | Kong | 174/68.5 X |
| 4,110,904 | 9/1978 | Johnson | 174/68.5 X |

OTHER PUBLICATIONS

George Mesner, Multilayer Printed Circuits, Int. Electronic Packaging Symposium, U. of Colo., Boulder, Colo., Aug. 1953, pp. 9 to 11.
D. H. Apgar, Folded Beam-Type Connector, IBM Tech. Dis. Bull., vol. 12 #6, pp. 775 & 776.
R. Cechanek, Multilayer Printed-Circuit Boards, IBM Tech. Dis. Bull., vol. 20 #11B, Apr. 1978, pp. 4726 7 4727.

Primary Examiner—Richard R. Kucia
Attorney, Agent, or Firm—Freilich, Hornbaker, Wasserman, Rosen & Fernandez

[57]  ABSTRACT

A circuit board apparatus of the type which has multiple connection regions that can each make a solder connection to the lead of a component and a weld connection to a wire, which minimizes the possibility of damage to the region during wire welding and which facilitates repair. Each connection region of the printed circuit board includes at least two plated-through holes plated by a solderable material such as copper which also interconnects the holes, and a pin of weldable but solder-rejecting material such as stainless steel which lies in one of the holes and is in press fit contact with the walls of the hole. Component leads can be soldered into the pinless holes as by wave soldering techniques, without coating the pins with solder, and wires can be welded to the pins by stitch wire techniques. The pins permit wire welds to be made thereto without requiring large weld currents to pass through the thin plating layer of the board, and also facilitate repair of a damaged weld by replacement of the pin.

9 Claims, 8 Drawing Figures

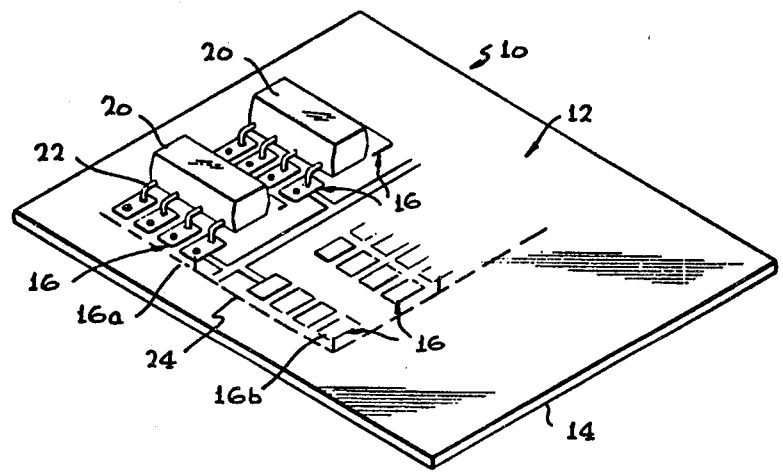
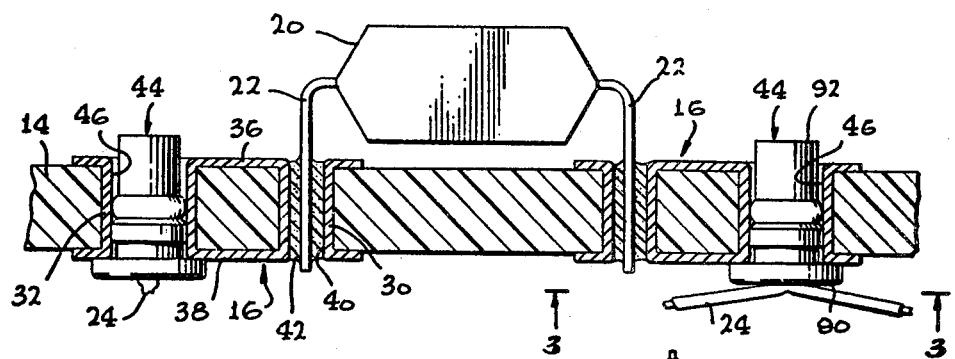
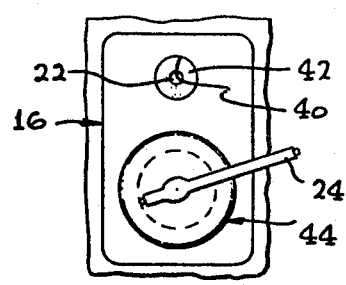
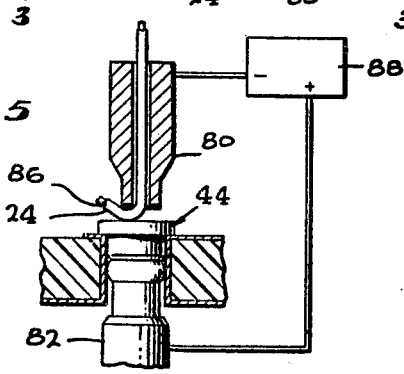

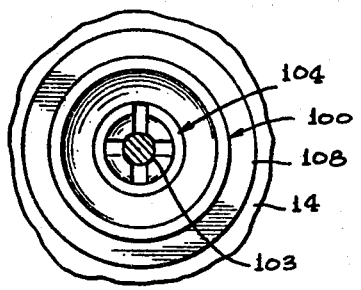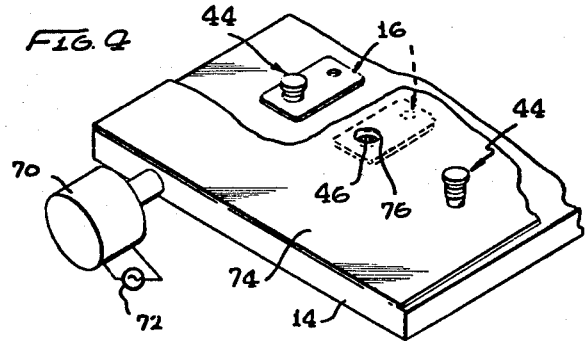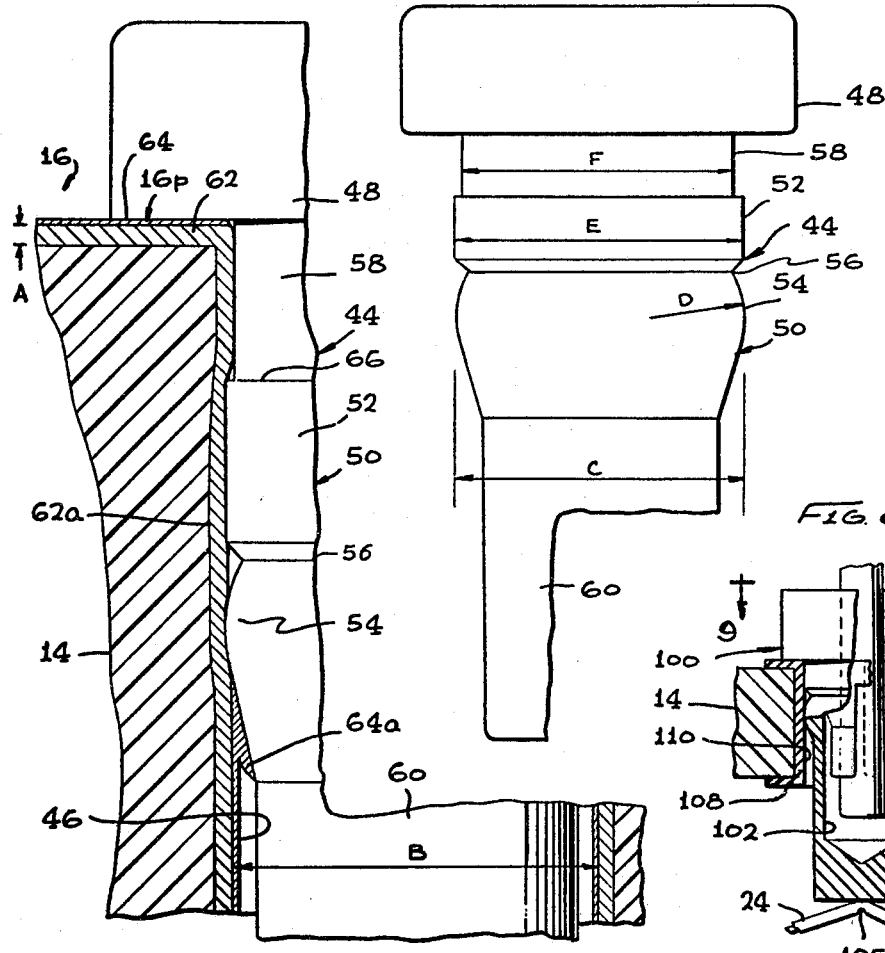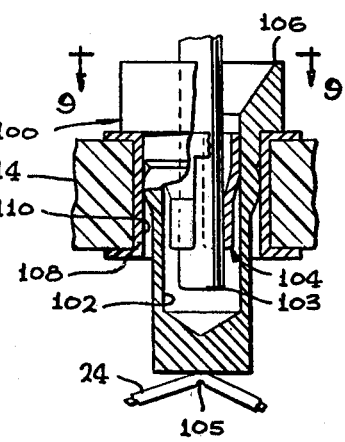

CIRCUIT BOARD WITH WELDABLE TERMINALS

This is a division of application Ser. No. 044,404, filed June 1, 1979, now U.S. Pat. No. 4,242,719, issued Dec. 30, 1980.

BACKGROUND OF THE INVENTION

One approach utilized to manufacture high reliability circuit boards, involves the creation of a multiplicity of connection regions or terminals on the board, the connection of component leads to the terminals by soldering the leads into holes thereof, and the connection of wires to the terminals by welding them thereto. One early technique involves the use of pins formed to be both solderable and weldable. A typical pin of this type includes a stainless steel body with a nickel plating thereon to activate the stainless steel, and with a gold plating over the nickel to enhance solderability. The plating thicknesses must be controlled very closely, because if the plating is too thick the pin becomes unweldable, and if the plating is too thin, the pin becomes unsolderable. The need for very close control of plating results in considerable cost and reduced reliability for the circuit board. Another technique, described in my earlier U.S. Pat. No. 3,786,172, utilizes a board with plated-through holes of solderable material such as copper, and a cladding or plating of weldable materials such as stainless steel which lies under the copper layer, and with the copper layer being removed at selected locations to enable resistance welding to the stainless steel layer. While this technique avoids the need for special precision plated pins, it has the disadvantage that the high weld current passes directly through the plated through hole, and in some cases the plated through hole is damaged or completely burned away. In both of these approaches, repair of a damaged weld is difficult.

SUMMARY OF THE INVENTION

In accordance with one embodiment of the present invention, a solderable and weldable circuit board system is provided, which facilitates construction and repair at relatively low cost and with high reliability. The circuit board apparatus includes a plating or layer of solderable material such as copper disposed on and in the holes of a base board, and forming a plurality of separate connection regions that each have at least two plated-through holes. A pin of weldable material is disposed in one of the holes of each connection region, and lies in press-fit contact with the layer of solderable material on the walls of the holes. A complete circuit board can be constructed by soldering in the leads of components into the pin-free holes of selected connection regions, and by stitch welding wires to selected weld pins. The weld pins are preferably constructed of a weldable material such as stainless steel, which rejects adhesion of solder thereto, so that the component leads can be soldered in by the application of solder to substantially all of the board, as by the wave solder technique, without coating the weld pins with solder.

The weld pins can be formed with a head that lies on the board and a stem which projects through the hole, and with a pair of collars on the stem. A forward collar, which is the first to enter the hole during pin insertion, has a rounded periphery, to serve as a burnishing bump that smooths and conditions the hole as the pin is inserted. Both collars are formed with continuous circular peripheries, to form gas-tight seals against the walls of the hole, to avoid corrosion of the contact area. The solderable layer on the board can be constructed of a solderable material such as copper covered with a film of protective but solderable material such as solder. The collars on the pin are of a diameter larger than the greatest diameter of the solder layer and the inside diameter of the copper main layer, so that as the pin is inserted the forward collar displaces the solder coating to assure press fit contact of the collars directly with the copper. This avoids loosening of the press fit due to melting of the solder during wave soldering of the board to install component leads.

The weld pins can be installed by laying them on the board and vibrating the board. It is found that when the board is vibrated, the pins stand on their narrow or stem end, which enables a large number of pins to be quickly dropped into the holes. A mask can be laid over the board prior to vibrating the pins thereon, with the mask having holes aligned with the holes which are to receive the pins, to facilitate installation. After the pins drop into the holes, they can be fully pressed into position as in a hydraulic press.

The novel features of the invention are set forth with particularity in the appended claims. The invention will be best understood from the following description when read in conjunction with the accompanying drawings.

BRIEF DESCRIPTION OF THE DRAWINGS

FIG. 1 is a partial perspective view of a circuit board assembly constructed in accordance with the present invention.

FIG. 2 is a partially sectional view of the board assembly of FIG. 1.

FIG. 3 is a view taken on the line 3—3 of FIG. 2.

FIG. 4 is a simplified perspective view of a step in the method of the invention, showing the installation of weld pins in a board.

FIG. 5 is a simplified sectional view of another step in the method of the invention, wherein wires are welded to the weld pins after their installation in the board.

FIG. 6 is a greatly enlarged elevation view of a weld pin of the board assembly of FIG. 2.

FIG. 7 is a greatly enlarged partial sectional view of the board assembly of FIG. 2.

FIG. 8 is a partially sectional view of a board apparatus constructed in accordance with another embodiment of the invention.

FIG. 9 is a view taken on the line 9—9 of FIG. 8.

DESCRIPTION OF THE PREFERRED EMBODIMENT

FIG. 1 illustrates a circuit assembly 10 constructed in accordance with the invention, which includes a printed circuit board 12 containing an insulative base board or base 14 and conductive paths or connection regions 16 formed thereon. Circuit components 20 such as integrated circuits or carriers that receive integrated circuits or the like, have leads 22 that are attached to the circuit board by solder connections. Each lead 22 extends through a hole in the circuit board and is soldered in place therein. In addition, some of the connection regions such as 16a and 16b are connected together by wires 24 that are welded thereto. FIG. 2 illustrates details of two connection regions 16 which each make electrical connection with a component lead 22 and the conductive core of a wire 24.

Diffusion bonding by resistance welding, and soldering are two common techniques used in making electrical connections, which require different characteristics of materials. Good soldering usually requires material of relatively high chemical activity, in order that its surface oxides can be rapidly removed by rosin flux to permit the solder to adhere thereto. Resistance welding generally requires materials of moderate resistance, so that considerable heat is generated by current passing therethrough. Materials such as copper are easily soldered, but they are not reliably resistance welded due to their high electrical and thermal conductivity. The making of electrical connection by welding can be accomplished by utilizing a wire of a material such as nickel or a nickel alloy, which has a resistivity about six times that of copper, by welding it to a material of even higher resistivity such as stainless steel, which typically has a resistivity of about forty times that of copper. Pure copper has a resistivity of 1.67 micro ohm-centimeter, while pure nickel has a resistivity of about 10 micro ohm-centimeters and type 303 stainless steel has a resistivity of about 70 micro ohm-centimeters. The resistance weldable material normally should not have a resistance of more than an order of magnitude higher than stainless steel, or else it will not be readily resistance-weldable to common weld wires such as nickel.

The circuit board assembly of FIG. 2 can be constructed by drilling holes in the base board 14 and then plating the board with a layer of highly conductive solderable material such as copper. The plating is conducted in only selected regions, or is conducted over the entire board and an etching step is conducted to remove unwanted areas, to provide the connection regions 16. Each connection region includes conductive hole walls 30, 32 and joining areas 36, 38 connecting the walls of the holes. A component lead 22 is installed in one of the holes 40 by a quantity of solder 42 which solderably adheres to the walls of the hole 30 and to the lead 22. The weldable wire 24 is connected to the connection region 16 by first installing a weld pin 44 in a corresponding pin-receiving hole 46, and then resistance welding the wire 24 to the pin.

As is shown in greater detail in FIGS. 6 and 7, each weld pin 44 includes an enlarged head 48 which is larger than the hole 46 and is designed to rest on a surface of the solderable layer, and a stem 50 which is designed to pass through the hole. The stem includes two collars 52, 54 which are axially-spaced apart, with a groove 56 between them. The stem also has a reduced diameter rearward portion 58 and a reduced diameter forward portion 60.

An understanding of the manner of fit of the weld pin 44 in the plated-through hole 46 of the circuit board, can be understood by first considering the composition of a typical plating 16P of a connection region 16. The conductive layer or plating 16P can be constructed of an underlayer 62 of copper covered by an overlayer 64 of solder such as a tin-lead composition. The solder coating 64 is provided to guard against corrosion of the copper surface, which is likely to occur within a few days after its deposition. While a typical prior art printed circuit board utilized a copper layer of about one mil (thousandth of an inch), the layer 62 utilized in circuit boards constructed in accordance with the present invention have had a thickness A of 2 mil. The increased thickness is desirable, especially in the hole 46, to facilitate a reliable press fit between the weld pin and the walls of the hole, although circuit boards of the invention can be designed with a wide range of conductive layer thicknesses. The solder layer 64 in a typical plate and etch board fabricating method is about 0.5 mil, and is about 1/10th as much in a typical print and etch process. The weld pin 44 is constructed so that the collars 52, 54 will directly engage the copper underlayer 62 in a press fit therewith, rather than the solder layer 64. This is desirable because during wave soldering of the component leads, the solder layer 64 will melt and relieve any contact pressure thereagainst.

The forward collar 54 is formed with a rounded periphery, to serve as a conditioning bump. That is, the forward collar 54 serves not only to scrape away the solder layer such as at 64a which lies on the walls of the hole 46, but also serves to burnish the copper layer at 62a which forms a wall of the hole. The forward collar or conditioning bump 54 reduces irregularities in the copper layer to provide a larger area contact of the bump 54 with the copper layer 62a, and conditions the hole to provide better contact between the rearward collar 52 and the copper layer. Both of the collars 52, 54 extend in a smooth continuous curve around the pin, to form a gas-tight seal against the walls of the hole. Such a gas-tight seal helps keep out gases that would corrode the copper layer 62a at the region where it contacts the collars, to thereby enhance the reliability of electrical contact over long periods of usage. It may be noted that the groove 56 is provided to stress relieve the board 14. It has been found that where large numbers of weld pins were inserted into a typical fiberglass reinforced resin base board, and where the pins did not have a groove at 56, the boards tended to delaminate. However, the forming of the grooves 56 in the pins was found to avoid such delamination. The pin forms a sharp step at 66 which helps to hold it in place. The forward portion 60 of the stem is made long enough to project from the face of the board opposite the head 48, to provide projecting pin portions at either face of the board against which a wire welding electrode set can press.

In a series of printed circuit boards that have been constructed, the holes were formed with diameters B, as measured at the inside diameters of the copper layer, of 35 mil. The weld pins were formed of type 303E stainless steel. The conditioning bump 54 had an outer diameter C of 38 mil, to provide an interference fit of 1.5 mil with the copper layer at 62a. Of course, the copper layer in the hole is not only slightly reduced in thickness by the burnishing bump, but deflects outwardly because of the pressure. The periphery of the conditioning bump was formed to a radius D of 28 mil, to provide for burnishing rather than irregular scraping of the copper walls of the hole. The rearward collar 52 was formed with a diameter E which is the same as the diameter C, although it could be formed slightly larger if desired. Forming the two collars 52, 54 to the same diameter facilitates construction of the pins on precision screw machines. The rearward portion 58 of the pin was formed to a diameter F of 35 mil, so that it approximately matched the hole diameter. It was found that after installation of the pin 44 in the hole 46, the pin had a retention strength of about 20 pounds. It was found that an installed pin could be removed and another identical pin installed in its place, and with the replacement pin having a retention strength about 80% that of the first pin.

The need to insert numerous weld pins into holes of the printed circuit board, could add appreciably to the cost of construction of the board. However, it is found that this can be accomplished by the use of a conventional vibrator such as the type utilized to feed small parts down a chute. It has been found that when the weld pins, with an enlarged head at one end lie on a vibrating surface, that the pins stand up with their stem ends on the surface and their enlarged head ends away from the surface. FIG. 4 illustrates a technique utilized to install the pins, which includes laying the pins 44 over the board 14 and applying a vibrator indicated at 70 to the board. The vibrator may be of a type which is driven by a source 72 such as a powerline that vibrates the vibrator output at a frequency such as 60 or 120 Hz. The pins "dance" on the vibrating surface and fall into the holes 46. Since the circuit board may not have a smooth and regular surface, as due to the individual connection regions 16, it is found desirable to provide a mask 74 such as a thin sheet of Mylar, with holes such as 76 aligned with the pin-receiving holes 46. It is found that after the pins have been placed on the mask which lies on the board, the pins fill the holes after about 40 seconds of vibration of the board. The pins fall only partially into the holes, and after the vibration step, the board with the pins partially installed therein is placed on a hydraulic press to press the pins fully into the board until the heads of the pins lie against the conductive layer on the board.

A circuit board apparatus such as that shown at 10 in FIG. 1, can be constructed by first forming the conductive layer (copper coated by solder) in separated connection regions, on the board face and in the holes. The pins then can be installed as by utilizing the vibration method followed by hydraulic press insertion. The leads of components then can be installed in the lead-receiving holes. The leads can be soldered into the holes by wave soldering, wherein solder is applied across the entire board to rapidly solder all leads into place. Because of the fact that the weld pins 44 are constructed of a solder-rejecting material such as stainless steel, the pins will not be coated with solder. This is important because a solder coating could hamper the welding of wires to the pins. After the components have been welded into place, the weld wire 24 can be welded to selected pins by a stitch wire process. FIG. 5 illustrates a typical stitch wire process, wherein a pair of electrodes 80, 82 are pressed against opposite ends of the pin 44, but with the wire 24 disposed between one of the electrodes 80 and the pin face. The wire 24 includes an insulation layer of a material such as Teflon, and a conductive core of an easily weldable material such as nickel. The electrodes are pressed with sufficient force to crush the insulation, so that the wire core 86 contacts one of the electrodes 80 and the adjacent face of the pin. Current is then passed from a current source 88 through the electrodes and through the wire and pin to weld the wire to the pin. It is normally easiest to position the bodies of circuit components such as the integrated circuit 20 on one face of the board, and to position the stitch wires 24 at the opposite face of the board. In this case, the rearward end 90 (FIG. 2) of the pin should have a largely smooth and flat surface to facilitate welding of the wire thereto. It is also possible to stitch weld a wire to the other face of the pin, by carefully routing the wire around the components, and in that case, the other face 92 of the pin, at the end of the stem, should be substantially flat and smooth to enable resistance welding of wire thereto. Another technique for enabling multiple stitch wire connections to a connection region 16, is to provide more than one pin-receiving hole in connection regions, so that there are at least two weld pins to which wire can be stitch welded.

In situations where the highest packaging density is required, as well as high reliability pluggable component lead connection, a weldable socket pin can be utilized, such as that shown at 100 in FIG. 8. The pin 100 is similar to the pin 44 of FIGS. 1–7 except that it has a socket shell 102 for receiving a component lead indicated at 103. A spring clip 104 of spring material such as nickel and gold plated beryllium copper, is press fitted into the socket pin shell 102. The component lead can be plugged into the clip and is held by spring force to the clip. The pin 100 can be constructed with a somewhat greater length than a pin used only for welding, to provide a deeper socket 102. The wire 24 is welded to the stem end of the pin at 105. The welding is conducted prior to the installation of a component lead in the socket 102, as by utilizing the apparatus of FIG. 5, but with the wire-holding electrode 80 lying against the stem end of the pin and the other electrode such as 82 being wide enough to press against the periphery 106 of the head end which lies around the hole 102 of the pin. A component lead is then plugged into the clip 104. The connection region 108 on the board 14 is made only large enough to provide the hole 110 to receive the socket pin 100, with the copper layer in the hole serving to reliably hold the pin in position in the base board 14. By allowing the component lead 103 to be plugged in along the same axis as the wire weld 105 (within the boundaries defined by the hole 110), a very high density of components can be mounted. Since each connection region 108 on the board is only large enough to receive a pin, considerable space is available between rows of connection regions 108 (and under the bodies of the integrated circuits), to hold power and ground distribution busses. Such busses can be etched onto the board when the connection regions are formed.

Thus, the invention provides a circuit board system of the type that requires both solder and weld connections, which is of high reliability and relatively low cost. This can be accomplished by the use of weld pins that lie in plated-through holes of the circuit board and that are held in press fit contact with the walls of the hole. The pins are formed of a weldable material which rejects the adhesion of solder thereto, so that they can be emplaced prior to mass soldering of components into the board, without substantially coating the weld pin surfaces with solder. The pins can be constructed with a pair of collars formed to scrape or otherwise strip off a solder film on a copper undercoat of the circuit board to make direct contact with the copper of the hole. One of the collars can be formed as a burnishing bump with a rounded periphery that serves to condition the hole and provide a gas-tight fit therewith, as well as enabling the collar behind it to make gas-tight contact with the copper. The pins with enlarged heads, can be installed by vibrating the board, which has been found to cause the pins to stand on their narrow ends and fall into holes. A mask with holes in it that are aligned with the pin-receiving holes, can be utilized to enhance the installation.

Although particular embodiments of the invention have been described and illustrated herein, it is recognized that modifications and variations may readily occur to those skilled in the art and consequently, it is intended that the claims be interpreted to cover such modifications and equivalents.

The embodiments of the invention in which an exclusive property or privilege is claimed are defined as follows:

1. A solderable and weldable circuit board apparatus comprising:
a base board having a multiplicity of holes therein;
a layer of solderable material disposed on said base board and forming a plurality of separate connection regions, the layer in each of said regions plating a plurality of holes and an area on said base board which connects the holes; and
a plurality of pins of weldable material, each lying in a selected one of said holes and having an electrode-engageable end to enable the welding of a wire thereto, each pin being in press-fit contact with the layer of solderable material on the walls of the hole but being free of bonding to the solderable material that plates the hole so the pin can be removed by forcing out without substantial damage to the walls of the hole;
each of said connection regions having at least one hole which holds one of said pinds and at least one other hole which is devoid of a pin to enable a lead to be soldered therein.

2. The apparatus described in claim 1 wherein:
the weldable material of each pin makes direct press-fit contact with solderable material that plates the hole.

3. The apparatus described in claim 1 including:
an electronic component having a plurality of leads disposed in holes of different selected connection region;
a quantity of solder lying in each of said selected holes and solderably holding the leads to the layer of solderable material at the walls of the holes; and
a wire welded to a plurality of said pins which are disposed in holes of different connection regions.

4. A circuit board apparatus comprising:
a base board of insulative material having a plurality of holes;
a layer of solderable material forming a plurality of connection regions on said board, the layer of each connection region covering the walls of at least a pair of adjacent holes and a portion of the board surface which connects the holes, said layer comprising an underlayer of copper and a film of solder lying over most of the copper; and
a plurality of weld pins of solder rejecting weldable material, each lying in a hole of a connection region so that each of a plurality of connection regions includes at least one hole containing a weld pin and at least one hole devoid of a weld pin;
each weld pin lying in press fit contact with the copper underlayer of a hole, with the solder film scraped away at the location of said press fit contact, and the ends of said pins projecting from opposite ends of the holes.

5. A circuit board apparatus comprising:
a base board having a hole and having metal plating the walls of said hole; and
a pin of weldable material having a stem lying in the hole and a head of larger diameter than the stem lying outside said hole, said stem having a pair of collars including a forward burnishing collar furthest from the head which has a substantially continuous rounded radially outer surface, and having a second collar lying between the burnishing collar and head and having a diameter at least as great as that of the burnishing collar, with both of said collars being in contact with said metal plating.

6. The apparatus described in claim 5 wherein:
said pin has a hole extending into its head end and partially through the pin, and the other end forms a substantially flat continuous surface for welding thereto; and including
a clip of spring material lying in said hole and having a component lead receiving hole, for resiliently engaging a lead inserted therein, whereby to enable both weld and plug-in connections to be made to the pin.

7. A circuit board apparatus comprising:
a base board of insulative material having a hole; and
a plurality of closely spaced pin devices which each includes a socket pin shell having opposite ends and having a hole extending from a first end and partially through the pin, said device also including a resilient spring clip lying in said hole and having a clip hole for receiving a component lead;
said pin shell being formed of weldable material and lying in said hole of said base board with the opposite ends of said pin shell accessible to opposite faces of said base board, said second end of said pin shell of weldable material being substantially flat and even to permit the resistance welding of a wire thereto, whereby a component lead can be plugged into one end of the pin device and a wire welded to the other end.

8. A solderable and weldable circuit board apparatus comprising:
a base board having a multiplicity of holes therein;
a layer of solderable material disposed on said base board and forming a plurality of separate connection regions, the layer portion in each of said regions plating a plurality of holes and an area on said base board which connects the holes; and
a plurality of pins of weldable material, each lying in a selected one of said holes and in press-fit contact with the layer of solderable material on the walls of the hole, each pin having an electrode-engageable end to enable the welding of a wire thereto;
each of said connection regions having at least one hole which holds one of said pins and at least one other hole which is devoid of a pin to enable a lead to be soldered therein;
said layer of solderable material including an underlayer of copper and an overlayer of solder on the copper, and each of said pins including at least one collar of a diameter large enough to scrape away the solder overlayer but not all the copper underlayer, whereby to assure direct contact of the pins with the copper underlayer.

9. A solderable and weldable circuit board apparatus comprising:
a base board having a multiplicity of holes therein;
a layer of solderable material disposed on said base board and forming a plurality of separate connection regions, the layer in each of said regions plating a plurality of holes and an area on said base board which connects the holes; and
a plurality of pins of weldable material, each lying in a selected one of said holes and in press-fit contact with the layer of solderable material on the walls of the hole, each pin having an electrode-engageable end to enable the welding of a wire thereto;
each of said connection regions having at least one hole which holds one of said pins and at least one other hole which is devoid of a pin to enable a lead to be soldered therein;

each of said pins having an enlarged head at the rear of the pin, and a pair of collars spaced along the length of the pin including a forward collar which has a rounded radially outer portion and a second collar behind said forward collar, said second collar having a diameter at least as great as that of the forward collar, and both of said collars having a smooth continuous circumferentially-extending surface to form a gas tight seal against the layer of solderable material.

* * * * *